(12) United States Patent
Shen et al.

(10) Patent No.: US 6,933,243 B2
(45) Date of Patent: Aug. 23, 2005

(54) HIGH SELECTIVITY AND RESIDUE FREE PROCESS FOR METAL ON THIN DIELECTRIC GATE ETCH APPLICATION

(75) Inventors: Meihua Shen, Fremont, CA (US); Yan Du, San Jose, CA (US); Nicolas Gani, Milpitas, CA (US); Oranna Yauw, Singapore (SG); Hakeem M. Oluseyi, Richmond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 10/279,320

(22) Filed: Oct. 23, 2002

(65) Prior Publication Data

US 2003/0148622 A1 Aug. 7, 2003

Related U.S. Application Data

(60) Provisional application No. 60/354,576, filed on Feb. 6, 2002.

(51) Int. Cl.[7] .............................................. H01L 21/302
(52) U.S. Cl. ........................ 438/720; 438/722; 438/734
(58) Field of Search ................................ 438/706, 714, 438/719, 720, 722, 734, 740

(56) References Cited

U.S. PATENT DOCUMENTS

| | | | |
|---|---|---|---|
| 5,656,529 A | 8/1997 | Fukase ...................... | 438/398 |
| 5,846,886 A * | 12/1998 | Hattori et al. .............. | 438/740 |
| 6,143,665 A * | 11/2000 | Hsieh ........................ | 438/710 |
| 6,235,644 B1 * | 5/2001 | Chou .......................... | 438/734 |
| 6,270,634 B1 | 8/2001 | Kumar et al. .......... | 204/192.37 |
| 6,284,636 B1 | 9/2001 | Hossain et al. ............. | 438/592 |
| 6,335,254 B1 | 1/2002 | Trivedi ....................... | 438/305 |
| 6,335,292 B1 | 1/2002 | Li et al. ...................... | 438/714 |
| 6,423,644 B1 * | 7/2002 | Nallan et al. ............... | 438/714 |
| 6,440,870 B1 | 8/2002 | Nallan et al. ............... | 438/734 |
| 6,551,942 B2 * | 4/2003 | Naeem ........................ | 438/714 |

FOREIGN PATENT DOCUMENTS

WO  WO 02/065539 A1  8/2002

OTHER PUBLICATIONS

U.S. Appl. No. 09/931,324, filed Aug. 16, 2001.
"Silicon Trench Etching" Internet Article, pp. 1–7.

* cited by examiner

Primary Examiner—Kin-Chan Chen
(74) Attorney, Agent, or Firm—Mosec, Patterson & Sheridan, L.L.P.; Joseph Bach

(57) ABSTRACT

Methods for etching electrodes formed directly on gate dielectrics are provided. In one aspect, an etch process is provided which includes a main etch step, a soft landing step, and an over etch step. In another aspect, a method is described which includes performing a main etch having good etch rate uniformity and good profile uniformity, performing a soft landing step in which a metal/metal barrier interface can be determined, and performing an over etch step to selectively remove the metal barrier without negatively affecting the dielectric. In another aspect, a method is provided which includes a first non-selective etch chemistry for bulk removal of electrode material, a second intermediate selective etch chemistry with end point capability, and then a selective etch chemistry to stop on the gate dielectric.

18 Claims, 3 Drawing Sheets

US 6,933,243 B2

HIGH SELECTIVITY AND RESIDUE FREE PROCESS FOR METAL ON THIN DIELECTRIC GATE ETCH APPLICATION

This Application claims the benefit of Provisional Application No. 60/354,578 filed on Feb. 6, 2002.

BACKGROUND OF THE INVENTION

1. Field of the Invention

Embodiments of the invention relate to plasma enhanced etch processes. More particularly, embodiments of the invention relate to plasma etch processes useful in etching metals, such as tungsten and tungsten nitride, formed on thin dielectric materials in gate applications.

2. Description of the Related Art

Metal etching in gate applications with the metal film formed directly on the gate dielectric material is one of the most challenging processes in gate applications. Most metal films, such as tungsten and tungsten nitride, can be etched easily with fluorine containing species. However, fluorine containing species also etch the underlying gate dielectric at a substantial etch rate. Thus, selectivity between the metal film and the gate dielectric layer is difficult to maintain. Non-fluorine containing chemistry such as $Cl_2$ and $O_2$ chemistry can maintain adequate selectivity, but a large amount of oxidized tungsten byproduct deposition results and makes control of the gate profile very difficult. In addition, the residues or byproducts formed on a substrate as a result of $Cl_2$ and $O_2$ chemistry are hard to remove after the etching process is completed.

In gate applications, polysilicon has typically been used between the tungsten electrode and the gate dielectric. The polysilicon in these applications serves as a good etch stop for the tungsten etch process because the chemistry used to etch tungsten has good selectivity between tungsten and the polysilicon. Following the removal of tungsten using a fluorine based chemistry, the polysilicon can be removed with HBr and $O_2$ chemistry which has good selectivity between the polysilicon and the underlying gate dielectric. The HBr and $O_2$ chemistry is selective for the polysilicon and can be stopped on the underlying gate dielectric without damage to the gate dielectric.

In recent gate applications, a metal layer and a metal barrier layer, such as a metal nitride layer (e.g., tungsten and tungsten nitride) are formed on the gate dielectric. The polysilicon layer is preferably eliminated in these newer devices to provide increased speed of the device. With the elimination of the polysilicon layer as an etch stop, a process must be utilized which provides good etch rate uniformity and profile uniformity across the substrate surface while maintaining mask selectivity, i.e., etching selectivity between a hard mask on top of the gate electrode and the gate electrode. The process must also provide etching selectivity between the tungsten and the gate dielectric. However, process chemistry and conditions may often have opposite effect on profile control and gate dielectric selectivity. It can be difficult to maintain a balance between a good gate profile and high gate dielectric selectivity simultaneously. Etch processes which can be used to remove tungsten with good selectivity to gate dielectrics may result in the formation of large amounts of non-volatile byproducts, mainly $WO_3$, which deposit on the gate electrode and the hard mask on top of the gate electrode. The deposition of non-volatile byproducts can cause a significantly reduced etch rate and a tapered profile. The non-volatile byproducts are typically difficult to remove after the etching process.

Therefore, there is a need for a process for etching metals in gate applications in which the metal is formed on the gate dielectric, such as a gate oxide, without an etch stop being formed therebetween.

SUMMARY OF THE INVENTION

Embodiments of the invention relate to metal etch processes which include a first non-selective etch chemistry for bulk removal of electrode material, a second etch chemistry with end point capability, and then a selective etch chemistry to stop on the gate dielectric.

In another embodiment, an etch process is provided which includes a main etch step, a soft landing step, and an over etch step.

In another embodiment, an etch process is provided which includes performing a main etch step to remove bulk metal with good etch rate uniformity and good profile uniformity, performing a soft landing step in which a metal/metal barrier interface can be determined, and performing an over etch step to selectively remove the metal barrier without negatively affecting the gate dielectric.

DETAILED DESCRIPTION OF A PREFERRED EMBODIMENT

Figure 1:
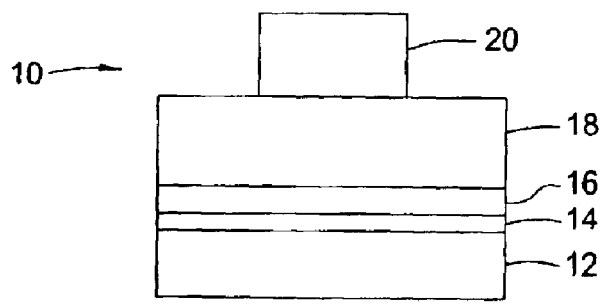
FIG. 1 is an illustration of a cross sectional view of a gate stack structure.

FIG. 1 is an illustration of a cross sectional view of a prior art gate stack structure 10. Embodiments of the invention will be described below in reference to this exemplary gate stack structure. The gate stack structure 10 generally includes about 2.5 nm to about 4.5 nm of gate dielectric 14 deposited on a silicon substrate 12. The gate dielectric 14 can include, for example, materials such as oxides, e.g., silicon oxide ($SiO_2$), or silicon nitride ($Si_3N_4$). About 5 nm to about 10 nm of tungsten nitride (WN) 16 is deposited over the gate dielectric 14. About 150 nm to about 250 nm of electrode material, such as tungsten (W) 18, is deposited over the tungsten nitride 16. About 200 nm of $Si_3N_4$ is used as a hard mask 20 on the tungsten layer 18 to pattern the gate structure 10 to be formed. Other gate applications may include different materials. For example, electrode materials may include tungsten, tungsten nitride, titanium, titanium nitride, tantalum and tantalum nitride. Gate dielectrics may include silicon oxide, silicon nitride, silicon oxynitride, aluminum oxide, tantalum pentoxide, and hafnium oxide, for example. Methods described herein can be utilized on gate structures formed from these materials.

Figure 2:
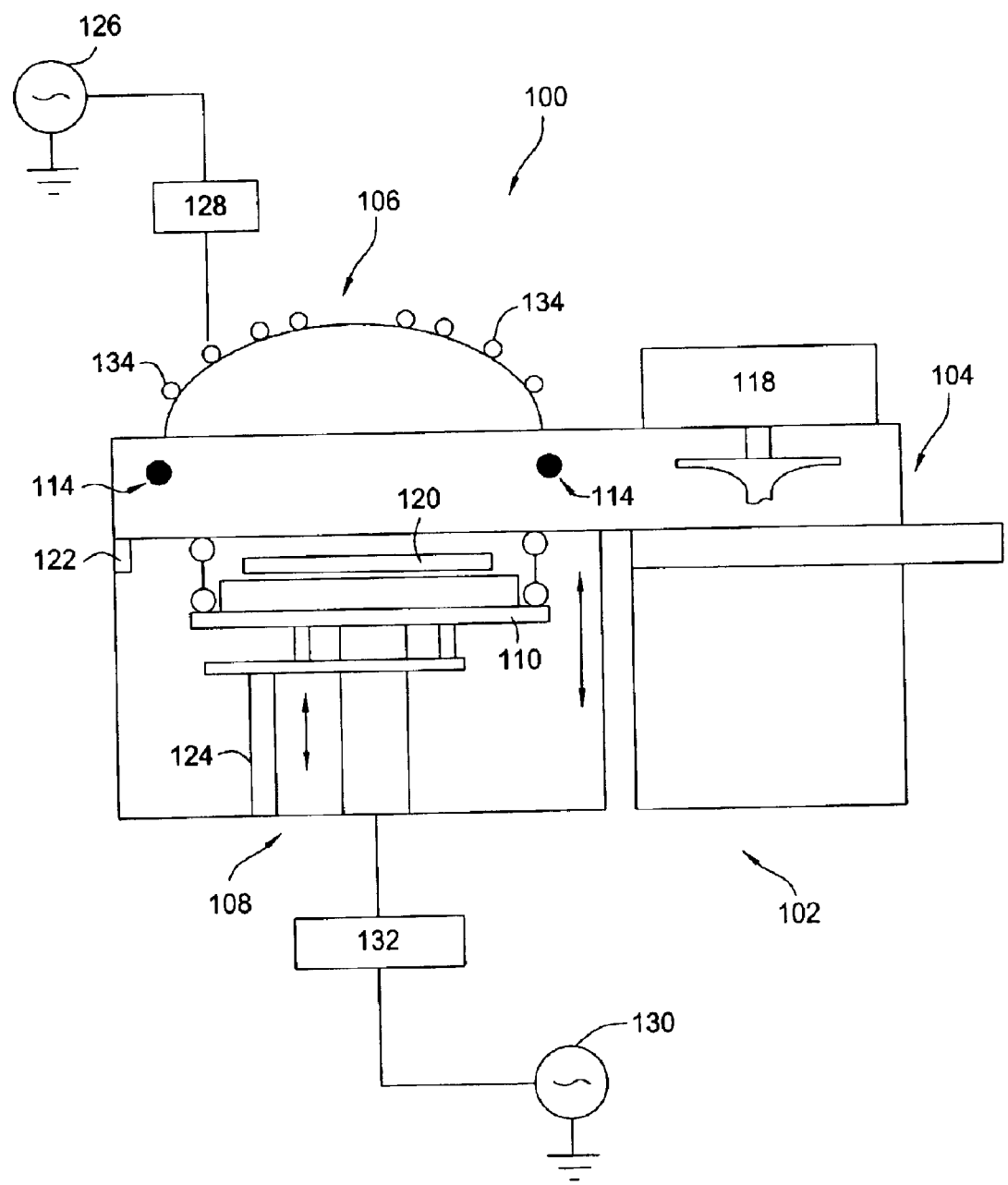
FIG. 2 is a schematic cross sectional view of a processing chamber useful in performing embodiments of the invention.

Embodiments of the invention described and claimed herein can be performed using a DPS-Poly etch chamber commercially available from Applied Materials, Inc. located in Santa Clara, Calif. The DPS-Poly etch chamber can be mounted on a Centura®-5200 etch mainframe which is also commercially available from Applied Materials, Inc. FIG. 2 is a schematic cross sectional view of a DPS-Poly etch chamber 100. The etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) using a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer (not shown) located under a dielectric film (not shown) on the chuck surface. The cathode 110 and substrate 120 are then raised by means of a wafer lift 124 and sealed against the upper chamber 104 in position for processing. Etch gases are introduced into the upper chamber 104 via gas injection nozzles 114. The etch chamber 100 uses an inductively coupled plasma source power 126 and matching network 128 operating at 12.56 MHz for generating and sustaining a medium to high density plasma. The wafer is biased with an RF source 130 and matching network 132 operating at 13.56 MHz. Plasma source power 126 and substrate biasing means 130 are controlled by separate controllers (not shown).

Another chamber that can be used to advantage is described in U.S. patent application Ser. No. 09/931,324, entitled "Adjustable Dual Frequency Voltage Dividing Plasma Reactor" which was filed on Aug. 16, 2001, and is incorporated herein by reference. The DPS chamber is only one example of a process chamber that can be used to perform processes described herein. Other etching systems can also be used to perform embodiments of the invention. In one aspect, the chambers preferably have a high temperature cathode or substrate support which can operate in a temperature above 80° C.

Figure 3:
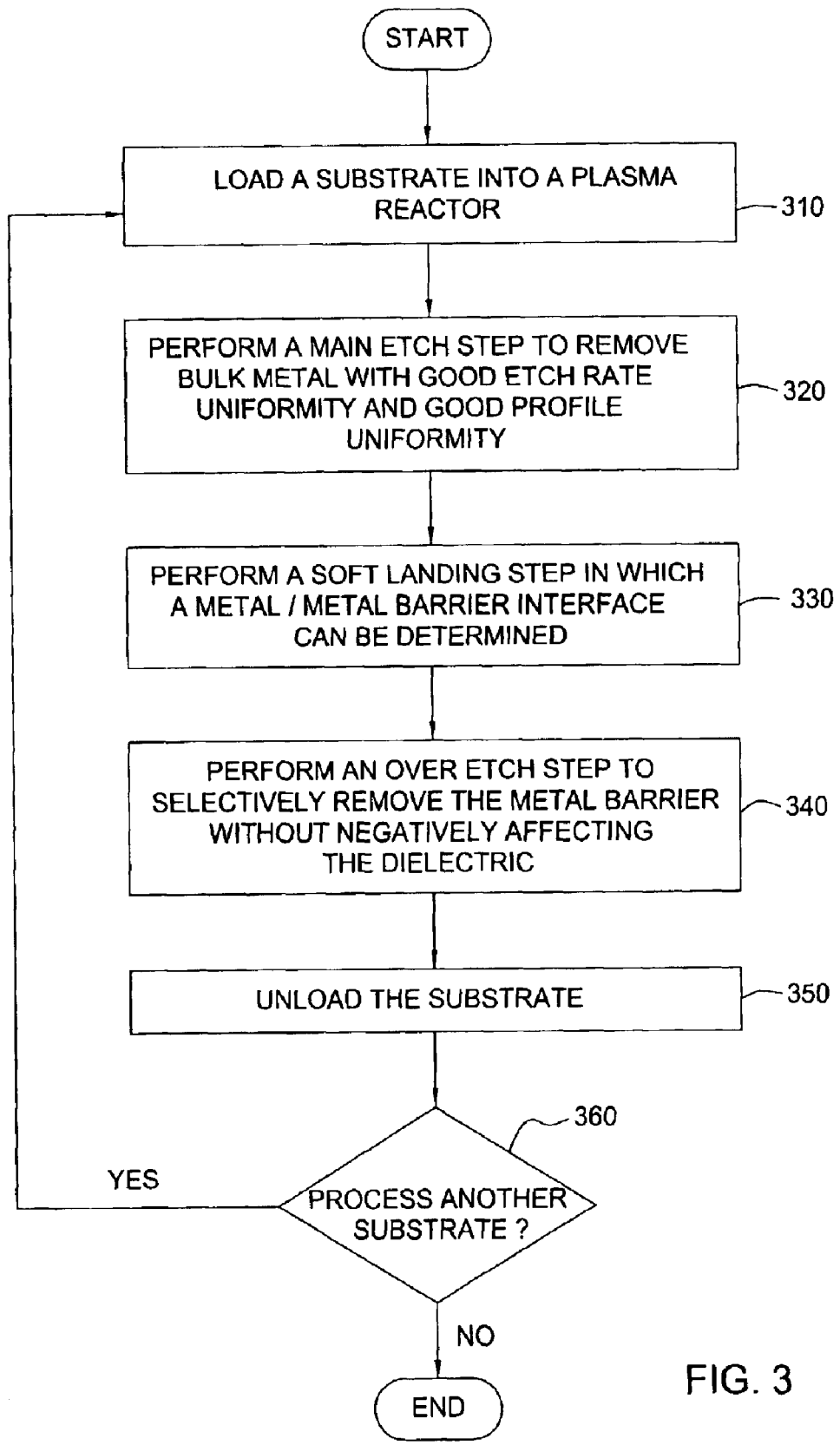
FIG. 3 is a flow diagram of one embodiment of the invention.

FIG. 3 is a process flow diagram illustrating one embodiment of an etching process of the invention. In step 310, a substrate is loaded into a plasma reactor, such as an etch chamber. In step 320, a main etch step is performed to remove bulk metal from the substrate with good etch rate uniformity and good profile uniformity. In step 330, a soft landing step is performed in which a metal/metal barrier interface on the substrate can be determined. In step 340, an over etch step is performed to selectively remove the metal barrier without negatively affecting the dielectric, such as an oxide, on the substrate. In step 350, the substrate is unloaded from the plasma reactor. Optionally, another substrate may be processed in the reactor, as shown at step 360.

Figure 4A:
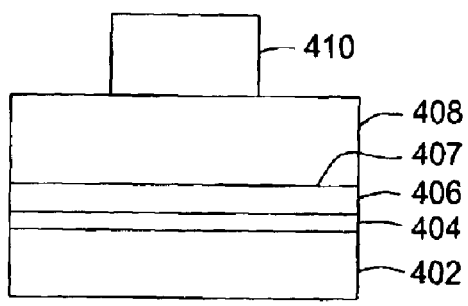
FIGS. 4A–4D are a series of schematic sectional views illustrating an embodiment of the process sequence.

FIGS. 4A–4D are a series of schematic sectional views illustrating an embodiment of the process sequence. FIG. 4A shows a substrate, e.g., a gate stack structure, 400 before being processed by a process sequence described herein. The substrate 400 includes a silicon substrate layer 402 on which a gate dielectric 404, such as a $SiO_2$ layer or a $Si_3N_4$ layer is deposited. A tungsten nitride barrier layer 406 is deposited on the gate dielectric 404. A tungsten layer 408 is deposited on the tungsten nitride layer 406. A hard mask layer 410 is deposited on the tungsten layer 408.

The process of this embodiment generally includes a main etch step, a soft landing step, and an over etch step. The multiple step etching approach for a gate stack structure may include a first step that removes the bulk, i.e., most, but not all of the metal film in the gate stack structure with a plasma from a first gas mixture, such as $NF_3$, $Cl_2$, $N_2$, and optionally, $O_2$, chemistry or $NF_3$, $Cl_2$, and $CF_4$ chemistry at high bias power to control the gate stack structure profile followed by a soft landing step with a plasma from a second gas mixture, such as $Cl_2$, $O_2$ and optionally, Ar, or $NF_3$, $Cl_2$, $N_2$ and optionally, $O_2$, chemistry, and an over etch step with a plasma from a third gas mixture, such as $NF_3$, $Cl_2$, $O_2$, and Ar chemistry or $Cl_2$ and $O_2$ chemistry with high selectivity to the dielectric layer. For a very thin tungsten nitride layer, $NF_3$ is not required, and a very low flow of $Cl_2$, $O_2$, and Ar chemistry can be used to balance etch selectivity and unwanted byproduct deposition. In one embodiment, the soft landing step uses very small amounts of $NF_3$ species along with $Cl_2$, $O_2$, and Ar to minimize tungsten oxide deposition on the substrate. The soft landing step may also use $Cl_2$, $O_2$, and Ar chemistry. A low flow of fluorine containing species along with the dilution of the oxygen contant in the etch chemistry with argon also reduces profile undercutting. Profile undercutting generally includes undesirable etching of the sidewalls of the gate electrode. The etch selectivity is achieved through very low bias power as well as oxygen addition during the soft landing step.

Figure 4B:
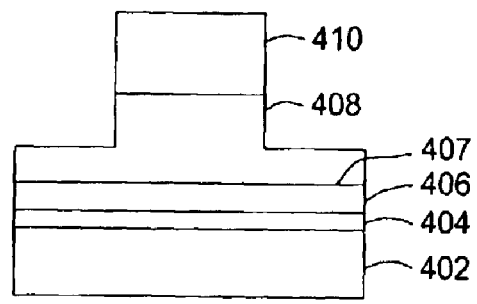

The main etch step is tailored to control the profile uniformity through etch rate uniformity control. The main etch also addresses hard-mask selectivity problems through oxygen balance. The main etch can be a timed etch process in which bulk tungsten is removed, and the bulk tungsten removal is stopped before the tungsten/tungsten nitride interface 407 is reached, as shown in FIG. 4B. The main etch process is preferably adapted to achieve good profile uniformity of the features being formed, good etch rate uniformity across the substrate surface, and good mask selectivity to maintain mask integrity.

In one embodiment, the main etch process can be operated in a pressure range of about 4 millitorr to about 15 millitorr in an etch chamber. A source power in the range of about 350 watts (W) to about 800 W can be delivered to the source coil. A bias power range of about 30 W to about 120 W can be delivered to the substrate support. A substrate can be etched using a plasma from a gas mixture including $NF_3$, $Cl_2$, and $N_2$ in the etch chamber. $NF_3$ can be flowed into the etch chamber at a rate in the range of about 10 sccm to about 50 sccm. $Cl_2$ can be flowed into the etch chamber at a rate in the range of about 8 sccm to about 150 sccm. $N_2$ can be flowed into the etch chamber at a rate in the range of about 25 sccm to about 75 sccm. $O_2$ can optionally be flowed into the etch chamber at a rate in the range of about 0 sccm to about 20 sccm. The ratio of $Cl_2/NF_3$ can be in the range of about 10:1 to about 1:1. A low flow of $NF_3$ may be advantageous to providing good uniformity.

In another embodiment, the main etch process can use $NF_3$, $Cl_2$, and $CF_4$. The main etch process using a plasma from a gas mixture including $NF_3$, $Cl_2$, and $CF_4$ can be performed in an etch chamber using the same ranges of pressure, source powers, and bias powers described above for a main etch process using $NF_3$, $Cl_2$, $N_2$, and optionally, $O_2$. $NF_3$ can be flowed into the etch chamber at a rate in the range of about 10 sccm to about 50 sccm. $Cl_2$ can be flowed into the etch chamber at a rate in the range of about 10 sccm to about 150 sccm. $CF_4$ can be flowed into the etch chamber at a rate in the range of about 10 sccm to about 30 sccm. It has been observed that the addition of $CF_4$ can help reduce the roughness of the metal film surface during etching. A smooth metal surface is desirable, since roughness or irregularities in the metal surface can be imaged into the dielectric layer during the main etch, where the selectivity between the metal and the dielectric is low.

Figure 4C:
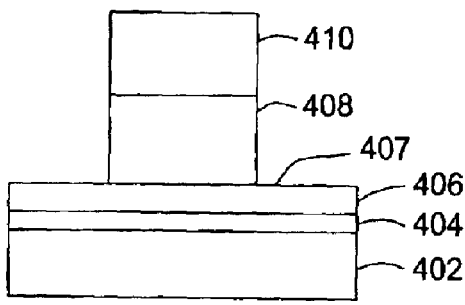

The soft landing step is used to end point at the tungsten/tungsten nitride interface 407, as shown in FIG. 4C, so that a highly selective over etch process can then be performed to stop on the thin gate dielectric 404 while maintaining dielectric integrity. While the main etch process removes a bulk amount of tungsten from the gate stack structure, the soft landing typically removes an amount of tungsten that is less than the bulk amount removed in the main etch process. The soft landing limits the amount of byproduct deposition by reducing the time of exposure to over etch $Cl_2$ and $O_2$ chemistry that can contribute to the formation of deposits, i.e., byproducts. The soft landing step utilizes a chemistry which minimizes $WO_3$ deposits and can be endpointed using, for example, an optical endpoint process such as optical emission spectroscopy measurement (OESM). By stopping on or close to the interface 407 of W/WN, only about 100 Å of WN 406 remains to be removed. At this point, a high selectivity chemistry can be used to remove the WN without negatively affecting the profile of the feature, the overall etch rate and the underlying gate dielectric 404. The soft landing step only needs to be performed for a short period of time to enable the end point process. For example, a time of about 10 seconds can be used to enable the W/WN interface 407 to be determined by the end point process. More or less time can be utilized depending on the time required for the end point process to be used effectively. Preferably, the time of the soft landing step is minimized to a time sufficient to determine the W/WN interface 407. The selectivity of the soft landing step can be controlled by the $O_2$ flow and a low bias power. In one embodiment, the soft landing step is performed with a lower bias than the main etch step. No or low amounts of $NF_3$ can also be used to control the amount of byproduct deposition.

The soft landing step can be performed at a pressure in the range of about 10 millitorr to about 50 millitorr, such as about 10 millitorr to about 30 millitorr, in an etch chamber. A source power of about 200 W to about 800 W, such as about 350 W, can be delivered to the source coil. A bias power in a range of about 10 W to about 50 W can be delivered to the substrate support. A substrate can be etched using a plasma from a gas mixture including $NF_3$, $Cl_2$, and $N_2$ in the etch chamber. $NF_3$ can be flowed into the etch chamber at a rate in the range of about 10 sccm to about 50 sccm. $Cl_2$ can be flowed into the etch chamber at a rate of about 20 sccm to about 100 sccm. $N_2$ can be flowed into the etch chamber at a rate of about 10 sccm to about 50 sccm. $O_2$ can optionally be flowed into the etch chamber at a rate in the range of about 0 sccm to about 20 sccm. Increasing the pressure, decreasing the bias power and decreasing the $NF_3$ flow rate provide better selectivity for the gate dielectric without causing pitting of the gate dielectric.

In another aspect of the invention, a low flow soft landing step with a plasma from a gas mixture including $Cl_2$ and $O_2$ is utilized to remove feet from the feature profiles. Generally, feet result from excess deposited material on features. While the ratio of $O_2/Cl_2$ determines the selectivity, the total flow of $O_2$ impacts the deposit formation. By lowering the total flow of $Cl_2$ and $O_2$, a balance between selectivity and low deposits can be achieved. During this soft landing step, the $O_2$ flow is less than about 20 sccm, and the $O_2/Cl_2$ ratio is less than about 1. Optionally, Ar or He can be added to maintain the pressure control at low $Cl_2$ and $O_2$ flow rates. The soft landing step can be performed at a pressure in the range of about 10 millitorr to about 20 millitorr in an etch chamber. A source power of about 600 W to about 1200 W can be delivered to the source coil. A bias power of about 40 W to about 100 W can be delivered to the substrate support. $Cl_2$ can be flowed into the etch chamber at a rate of about 20 sccm to about 100 sccm. $O_2$ can be flowed into the etch chamber at a rate of about 5 sccm to about 20 sccm.

Figure 4D:
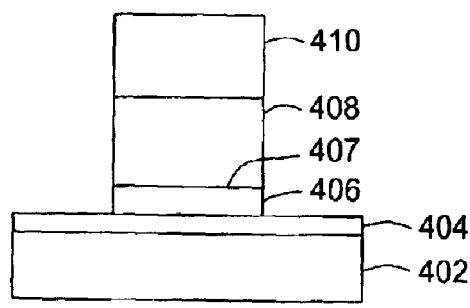

After the soft landing step has been performed and the etching is stopped at or near the W/WN interface 407, an over etch step can be performed to selectively remove the WN and stop on and expose the dielectric without causing pitting or other damage to the gate dielectric, as shown in FIG. 4D. The oxygen content of the over etch chemistry can be increased to have a higher selectivity to the dielectric, such as an oxide, compared to the main etch step and the soft landing. The length of exposure to the oxygen containing plasma can be minimized as only a thin layer of WN 406 needs to be removed in the over etch step.

The over etch step can be performed at a pressure of about 10 millitorr to about 50 millitorr, such as about 10 millitorr to about 30 millitorr in an etch chamber. A source power of about 500 W to about 1500 W can be delivered to the source coil. A bias power of about 50 W to about 150 W can be delivered to the substrate support. A substrate can be etched using a plasma from a gas mixture including $Cl_2$ and $O_2$ in the etch chamber. $Cl_2$ can be flowed into the etch chamber at a rate of about 20 sccm to about 100 sccm. $O_2$ can be flowed into the etch chamber at a rate of about 5 sccm to about 20 sccm. The $O_2/Cl_2$ ratio is at least one key to maintain the selectivity. Preferably, the ratio of $O_2/Cl_2$ is about 1:4 to about 1:2. Higher source power also enhances selectivity and etch rate. Relatively high bias power is used to prevent profile notching or undercutting near the bottom of the gate stack structure. The source power and the bias power in this embodiment may be higher than the source power and the bias power respectively of the soft landing step performed before the over etch step.

In another embodiment, an over etch step can be performed using a plasma from a gas mixture including $NF_3$, $Cl_2$, $O_2$, and Ar. The over etch can be performed at a pressure of about 20 millitorr to about 50 millitorr in an etch chamber. A source power of about 300 W to about 1000 W can be delivered to the source coil. A relatively low bias power of about 0 W to about 5 W can be delivered to the substrate support. $NF_3$ can be flowed into the etch chamber at a rate of about 3 sccm to about 10 sccm. $Cl_2$ can be flowed into the etch chamber at a rate of about 20 sccm to about 100 sccm. $O_2$ can be flowed into the etch chamber at a rate of about 5 sccm to about 20 sccm. Ar can be flowed into the etch chamber at a rate of about 50 sccm to about 200 sccm. The $NF_3$ may help prevent the formation of tungsten oxide deposits. This embodiment of an over etch step may be used with a lower bias power and less $NF_3$ than the soft landing step performed before the over etch step.

After the over etch step, the substrate can be exposed to a wet clean step using a wet chemistry such as 2 (2-aminoethoxy) ethanol hydroxylamine cathecol (known as EKC). The substrate can be exposed to the wet chemistry by dipping the substrate in the chemistry for about five (5) minutes or less. The EKC removes the passivation film formed over the structure which has been defined by the etch process. The minimized formation of the passivation film, such as $WO_3$, enables a shorter wet clean to be performed.

Any combination of the main etch, soft landing, and over etch steps described herein can be used in a three step etch process with a main etch step followed by a soft landing step followed by an over etch step. Typically, the soft landing step has a greater etch selectivity than the main etch step for etching a metal-containing layer of the substrate compared to a dielectric layer of the substrate, and the over etch step has a greater etch selectivity than the soft landing step for etching the metal-containing layer of the substrate compared to the dielectric layer of the substrate.

While three step etch processes including a main etch step, a soft landing step, and an over etch step have been described above, in one embodiment, a two step etch process comprising a main etch step and a combined soft landing and over etch step is also provided in embodiments of this invention. The main etch step can include exposing a substrate to a plasma from a gas mixture including $NF_3$, $Cl_2$, and $N_2$. The combined soft landing and over etch step can include exposing the substrate to a plasma from a gas mixture including $NF_3$, $Cl_2$, Ar, and $O_2$. Typically, the combined soft landing and over etch step has a greater etch selectivity than the main etch step for etching a metal-containing layer of the substrate compared to a dielectric layer of the substrate.

We have examined the capability of the DPS Poly chamber to etch a hardmasked ($Si_3N_4$) pure tungsten gate electrode with $SiO_2$ and $Si_3N_4$ gate dielectrics. We have studied the emission spectrum of substrates at the main etch endpoint and found that lines of F, $N_2$, O, and CN may be successfully utilized for endpoint. We have illustrated over etch dielectric selectivity performance in excess of 100:1 for $W:SiO_2$ and $W:Si_3N_4$ using $Cl_2$ and $O_2$ chemistry. While the over etch recipe's selectivity to the gate dielectrics is excellent, we note that the over etch recipe does leave a foot on the feature profiles due to its depositing nature, and also undercuts the barrier layer due to its 1.7:1 WN:W selectivity. We have illustrated that utilizing a low flow of $Cl_2$ and $O_2$ or a $Cl_2$, $O_2$, and Ar soft landing step may minimize the foot generation. We have also illustrated that undercuts in WN may be minimized by controlling the duration of the over etch step. To assist in further development of over etch and soft landing recipes we have presented an empirically derived model of process selectivity utilizing a selectivity factor, $\Psi$, which is a product of the source/bias power ratio and the $O_2$ percentage of the process chemistry. We have also performed Time of Flight-Secondary Ion Mass Spectroscopy (TOF-SIMS) and Electron Spectroscopy for Chemical Analysis/X-Ray Photoelectron Spectroscopy (ESCA/XPS) analyses of the over etch residues to also assist in further development. Finally we have presented a preliminary analysis of the cleanliness of the etch processes based on an Optical Emission Spectroscopy (OES) analysis. This analysis suggests that the F-containing main etch chemistry is relatively clean, whereas the full process including the soft landing and over etch chemistry is depositive, i.e., leaves deposits on a substrate.

EXAMPLE 1

A main etch step was performed under the following process conditions: chamber pressure: 4 millitorr; 350 watts source power; 100 watts bias power; 20 sccm $NF_3$; 70 sccm $Cl_2$; 90 sccm $N_2$; 10 sccm $O_2$. The main etch step was performed for about 60 seconds.

A soft landing step was performed thereafter under the following conditions: chamber pressure: 10 millitorr; 350 watts source power; 30 watts bias power; 20 sccm $NF_3$; 70 sccm $Cl_2$; 40 sccm $N_2$. The soft landing step was performed for about 24 seconds.

An over-etch step was performed thereafter under the following conditions: chamber pressure: 10 millitorr; 1000 watts source power; 70 watts bias power; 30 sccm $Cl_2$; 15 sccm $O_2$. The over etch process was performed for about 20 seconds.

Finally, the wafer was exposed to an EKC process step for about 5 minutes.

EXAMPLE 2

In another embodiment, the main etch of Example 1 was followed by different soft landing and over etch processes. The soft landing step used an $O_2$ flow of less than about 20 sccm and the $O_2/Cl_2$ ratio was less than 1.

The over etch step used a total flow of $Cl_2$ and $O_2$ between about 100 to about 120 sccm, and the ratio of $O_2/Cl_2$ was between about 1:4 to about 1:2. An SEM photograph of the substrate (not shown) showed that feet formation on the feature profiles is minimized.

EXAMPLE 3

A main etch step was performed under the following process conditions: chamber pressure: 4 millitorr; 350 watts source power; 120 watts bias power; 20 sccm $NF_3$; 70 sccm $Cl_2$; 30 sccm $N_2$.

An combined soft landing and over etch step was performed thereafter under the following conditions: chamber pressure: 30 millitorr; 300 watts source power; 5 watts bias power; 3 sccm $NF_3$; 50 sccm $Cl_2$; 140 sccm Ar; 5 sccm $O_2$.

While the foregoing is directed to preferred embodiments of the present invention, other and further embodiments of the invention may be devised without departing from the basic scope thereof, and the scope thereof is determined by the claims which follow.

What is claimed is:

1. A method of etching a substrate, comprising:
   a main etch step comprising exposing the substrate to a plasma from a first gas mixture wherein the main etch step removes a portion of a metal layer from the substrate;
   a soft landing step comprising exposing the substrate to a plasma from a second gas mixture wherein the soft landing step removes an additional portion of the metal layer to expose a metal nitride layer of the substrate;
   and an over etch step comprising exposing the substrate to a plasma from a third gas mixture, wherein the over etch step removes a portion of the metal nitride layer to expose a dielectric layer of the substrate, the soft landing step has a greater etch selectivity than the main etch step for etching a metal-containing layer of the substrate compared to a dielectric layer of the substrate, and the over etch step has a greater etch selectivity than the soft landing step for etching the metal-containing layer of the substrate compared to the dielectric layer of the substrate.

2. A method of etching a substrate, comprising:
   a main etch step comprising exposing the substrate to a plasma from a first gas mixture wherein the first gas mixture comprises $NF_3$, $Cl_2$, and $N_2$;
   a soft landing step comprising exposing the substrate to a plasma from a second gas mixture wherein the second gas mixture comprises $Cl_2$ and $O_2$;
   and an overetch step comprising exposing the substrate to a plasma from a third gas mixture wherein the third gas mixture comprises $Cl_2$ and $O_2$, the soft landing step has a greater etch selectivity than the main etch step for etching a metal-containing layer of the substrate compared to a dielectric layer of the substrate, and the over etch step has a greater etch selectivity than the soft landing step for etching the metal-containing layer of the substrate compared to the dielectric layer of the substrate.

3. The method of claim 2, wherein the main etch step is performed in an etch chamber having a pressure of about 4 millitorr to about 15 millitorr, a source power of about 350 W to about 800 W, and a bias power of about 30 W to about 120 W.

4. The method of claim 3, wherein the main etch step is performed with the first mixture of $NF_3$, $Cl_2$, and $N_2$, and the $NF_3$ is flowed into the etch chamber at a rate of about 10 sccm to about 50 sccm, the $Cl_2$ is flowed into the etch chamber at rate of about 8 sccm to about 150 sccm, and the $N_2$ is flowed into the etch chamber at a rate of about 25 sccm to about 75 sccm.

5. The method of claim 4, wherein the first mixture of the main etch step further comprises $O_2$, which is flowed into the etch chamber at a rate of about 0 sccm to about 20 sccm.

6. The method of claim 3, wherein main etch step is performed with the first mixture of $NF_3$, $Cl_2$, and $N_2$, and the ratio of $Cl_2$ to $NF_3$ is between about 10:1 to about 1:1.

7. The method of claim 3, wherein the main etch step is performed with the second mixture of $NF_3$, $Cl_2$, and $CF_4$, and the $NF_3$ is flowed into the etch chamber at a rate of about 10 sccm to about 50 sccm, the $Cl_2$ is flowed into the etch chamber at rate of about 10 scorn to about 150 sccm, and the $CF_4$ is flowed into the etch chamber at a rate of about 10 sccm to about 30 sccm.

8. The method of claim 3, wherein the soft landing etch step is performed with the third mixture including $NF_3$, $Cl_2$, and $N_2$, and the soft landing step is performed in the etch chamber with a pressure of about 10 millitorr to about 50 millitorr, a source power of about 200 W to about 800 W, a bias power of about 10 W to about 50 W, with the $NF_3$ flowed into the etch chamber at a rate of about 10 sccm to about 50 sccm, the $Cl_2$ flowed into the etch chamber at rate of about 20 sccm to about 100 sccm, and the $N_2$ flowed into the etch chamber at a rate of about 10 sccm to about 50 sccm.

9. The method of claim 8, wherein the third mixture of the soft landing step further comprises $O_2$, wherein the $O_2$ is flowed into the etch chamber at a rate of about 0 sccm to about 20 sccm.

10. The method of claim 3, wherein the soft landing step is performed with the second mixture including $Cl_2$ and $O_2$, and the soft landing step is performed in the etch chamber with a pressure of about 10 millitorr to about 20 millitorr, a source power of about 600 W to about 1200 W, a bias power of about 40 W to about 100 W, with the $Cl_2$ flowed into the etch chamber at rate of about 20 sccm to about 100 sccm, and the $O_2$ flowed into the etch chamber at a rate of about 5 sccm to about 20 sccm.

11. The method of claim 3, wherein the over etch step is performed with the fifth mixture including $NF_3$, $CL_2$, $O_2$, and Ar, wherein the soft landing etch step is performed in the etch chamber with a pressure of about 20 millitorr to about 50 millitorr, a source power of about 300 W to about 1000 W, a bias power of about 0 W to about 5 W, with the $NF_3$ flowed into the etch chamber at a rate of about 3 sccm to about 10 sccm, the $Cl_2$ flowed into the etch chamber at rate of about 20 sccm to about 100 sccm, the $O_2$ flowed into the etch chamber at a rate of about 5 sccm to about 20 sccm, and the Ar flowed into the etch chamber at a rate of about 50 sccm to about 200 sccm.

12. The method of claim 3, wherein the over etch step is performed with the third mixture including $Cl_2$ and $O_2$, wherein the over etch step is performed in the etch chamber with a pressure of about 10 millitorr to about 50 millitorr, a source power of about 500 W to about 1500 W, a bias power of about 50 W to about 150 W, with the $Cl_2$ flowed into the etch chamber at a rate of about 20 sccm to about 100 sccm, and the $O_2$ flowed into the etch chamber at a rate of about 5 sccm to about 20 sccm.

13. The method of claim 3, wherein the over etch step is performed with the third mixture including $Cl_2$ and $O_2$, wherein the over etch step is performed in the etch chamber having a pressure of about 10 millitorr to about 50 millitorr, a source power of about 500 W to about 1500 W, a bias power of about 50 W to about 150 W, with the $O_2$ and the $Cl_2$ being flowed into the chamber at a $O_2/Cl_2$ ratio between about 1:4 to about 1:2.

14. A method of etching a substrate, comprising:
a main etch step comprising exposing the substrate to a plasma from a gas mixture comprising $NF_3$, $Cl_2$, and $N_2$;
a soft landing step comprising exposing the substrate to a plasma from a gas mixture comprising $Cl_2$ and $O_2$;
and an over etch step comprising exposing the substrate to a plasma from a gas mixture comprising $Cl_2$ and $O_2$, wherein the soft landing step is performed with a lower bias power than the main etch step, and the over etch step has a greater etch selectivity than the main etch step and the soft landing step for etching a metal-containing layer of the substrate compared to a dielectric layer of the substrate.

15. The method of claim 14, wherein the over etch step uses the fifth mixture comprising $NF_3$, $Cl_2$, $O_2$, and Ar, a lower bias power, and less $NF_3$ than the soft landing step.

16. The method of claim 14, wherein the over etch step uses the third mixture including $Cl_2$ and $O_2$, a higher source power, and a higher bias power than the soft landing step.

17. A method of etching a substrate, comprising:
a main etch step comprising removing a bulk amount of tungsten from a gate structure;
a soft landing step comprising removing an additional amount of tungsten from the gate structure to expose a tungsten nitride layer of the substrate, wherein the additional amount is less than the bulk amount removed in the main etch step; and
an over etch step comprising removing at least a portion of the tungsten nitride layer of the substrate to expose a dielectric layer of the substrate.

18. The method of claim 17, wherein the main etch step comprises exposing the substrate to a plasma from a gas mixture comprising $NF_3$, $Cl_2$, and $N_2$;
the soft landing step comprises exposing the substrate to a plasma from a gas mixture comprising $Cl_2$ and $O_2$;
and the over etch step comprises exposing the substrate to a plasma from a gas mixture comprising $Cl_2$ and $O_2$.

* * * * *

UNITED STATES PATENT AND TRADEMARK OFFICE
CERTIFICATE OF CORRECTION

PATENT NO. : 6,933,243 B2  
DATED : August 23, 2005  
INVENTOR(S) : Meihua Shen

Page 1 of 1

It is certified that error appears in the above-identified patent and that said Letters Patent is hereby corrected as shown below:

<u>Title page,</u>  
Item [74], *Attorney, Agent, or Firm*, change "Mosec" to -- Moser --.

<u>Column 1,</u>  
Line 6, change "60/354,578" to -- 60/354,576 --.

<u>Column 9,</u>  
Line 18, change "scom" to -- sccm --.  
Line 45, change "$CL_2$" to -- $CI_2$ --.

Signed and Sealed this

Twenty-eighth Day of March, 2006

JON W. DUDAS  
*Director of the United States Patent and Trademark Office*